United States Patent
Miller et al.

(10) Patent No.: US 7,515,776 B1
(45) Date of Patent: *Apr. 7, 2009

(54) TEMPERATURE-CONTROLLED OPTICAL MODULATOR

(75) Inventors: David A. B. Miller, Stanford, CA (US); James S. Harris, Jr., Stanford, CA (US); Yu-Hsuan Kuo, Taipei (TW)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/524,035

(22) Filed: Sep. 19, 2006

Related U.S. Application Data

(63) Continuation-in-part of application No. 11/230,285, filed on Sep. 19, 2005.

(60) Provisional application No. 60/718,428, filed on Sep. 19, 2005, provisional application No. 60/635,093, filed on Dec. 9, 2004.

(51) Int. Cl.
*G02F 1/035* (2006.01)
*G02F 1/017* (2006.01)
*G02B 6/10* (2006.01)
*H01L 29/06* (2006.01)

(52) U.S. Cl. .............. 385/2; 385/3; 385/131; 385/141; 257/14; 257/21; 359/245

(58) Field of Classification Search .......... None
See application file for complete search history.

(56) References Cited

U.S. PATENT DOCUMENTS

| 5,523,592 | A  | * | 6/1996  | Nakagawa et al. ............ 257/96 |
| 5,886,361 | A  |   | 3/1999  | Presting et al. |
| 6,233,082 | B1 |   | 5/2001  | Johnson |
| 6,757,499 | B1 |   | 6/2004  | Aoki |
| 6,784,466 | B2 |   | 8/2004  | Chu et al. |
| 6,826,212 | B2 | * | 11/2004 | Shirai et al. .................. 372/36 |
| 2005/0141801 | A1 |  | 6/2005 | Gardner |
| 2006/0124919 | A1 | * | 6/2006 | Harris et al. .................. 257/19 |

OTHER PUBLICATIONS

Richard A. Soref, "Silicon-based group IV heterstructures for optoelectronic applications," J. Vac Sci. Techno. A 14(3), May/Jun. 1996, pp. 913-918.

* cited by examiner

*Primary Examiner*—Omar Rojas
(74) *Attorney, Agent, or Firm*—Lumen Patent Firm

(57) ABSTRACT

SiGe quantum wells where the well material has a lowest conduction band energy minimum at k=0 (the Γ point of the first Brillouin zone) are provided. Quantum well structures that satisfy this condition have "Kane-like" bands at and near k=0 which can provide physical effects useful for various device applications, especially optical modulators. In the $Si_{1-x}Ge_x$ material system, this condition on the band structure is satisfied for x greater than about 0.7. The quantum well barrier composition may or may not have Kane-like bands. Optical modulators including such SiGe quantum wells can be operated at temperatures other than room temperature. Such temperature control is preferred for providing optical modulators that operate in the telecommunication C band (~1530 nm to ~1565 nm).

20 Claims, 8 Drawing Sheets

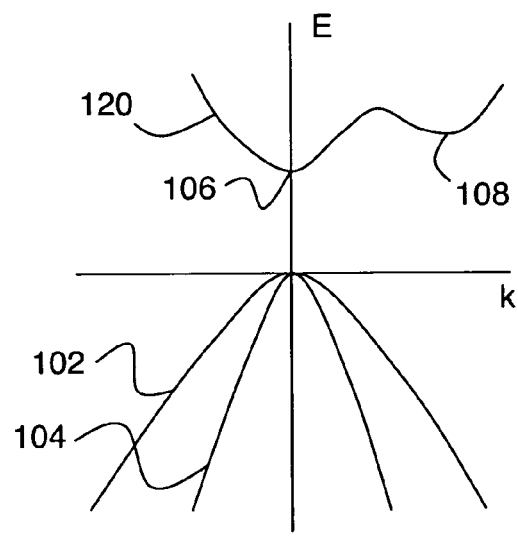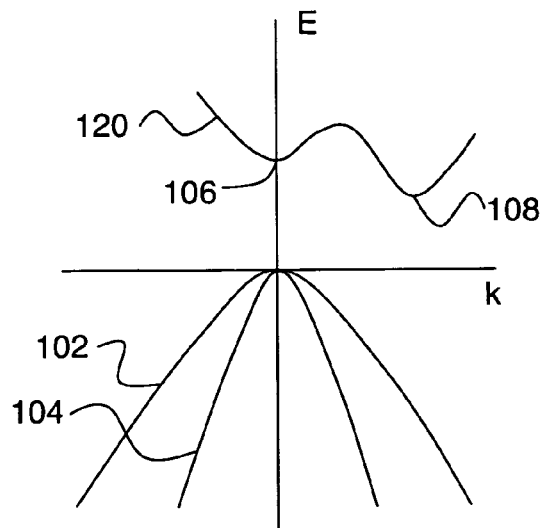
Fig. 1a    Fig. 1b
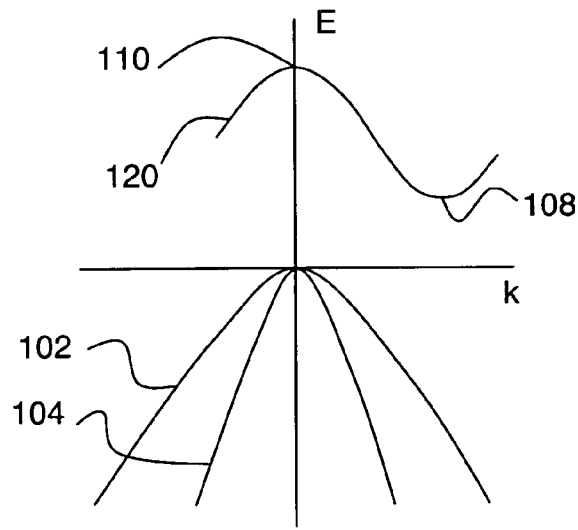
Fig. 1c

TEMPERATURE-CONTROLLED OPTICAL MODULATOR

CROSS REFERENCE TO RELATED APPLICATIONS

This application claims the benefit of U.S. provisional application 60/718,428, filed on Sep. 19, 2005, entitled "Heated Optical Modulator", and hereby incorporated by reference in its entirety. This application is also a continuation in part of U.S. application Ser. No. 11/230,285, filed on Sep. 19, 2005. U.S. application Ser. No. 11/230,285 claims the benefit of U.S. provisional application 60/635,093, filed on Dec. 9, 2004.

GOVERNMENT SPONSORSHIP

This invention was made with Government support under grant number W911NF-05-1-0251 (PTA number 194674-601-TBABC) from DARPA/Army Research Office. The Government has certain rights in this invention.

FIELD OF THE INVENTION

This invention relates to semiconductor quantum well structures.

BACKGROUND

Although silicon is the dominant material technology for most electronics applications, there are significant applications for which conventional silicon technology is unsuitable. For example, optoelectronic devices (e.g., sources, modulators and detectors) are typically fabricated in compound semiconductor material systems having more favorable optoelectronic properties than silicon. However, it is difficult to monolithically integrate silicon electronics with compound semiconductor optoelectronic devices, as desired for many applications. Accordingly, various approaches for providing Si-compatible optoelectronic devices have been under development for some time. An article entitled "Silicon-based group IV heterostructures for optoelectronic applications" by Richard A. Soref and published in the Journal of Vacuum Science and Technology, pp 913-918, May/June 1996, provides a review of some of these approaches.

The use of the Si/SiGe/Ge material system is one approach under consideration for Si-compatible optoelectronics. However, the lattice mismatch of about 4% between Si and Ge is a significant complication for epitaxial growth of Ge (or Ge-rich SiGe) on silicon. A conventional approach for managing the lattice mismatch is to grow a buffer layer having a graded composition on a Si substrate, e.g., as considered in U.S. Pat. No. 6,784,466. The buffer layer composition is increasingly Ge rich as the distance from the substrate increases. In this manner, the strain introduced by the lattice mismatch can be accommodated in the buffer layer. However, this fabrication approach is disadvantageous, because the graded buffer layer may need to be relatively thick (e.g., 5-10 microns or so) which is costly, and because the resulting device chips are often mechanically fragile. It also results in a surface that is too rough for the growth of uniform, thin Ge or Ge-rich SiGe layers on thick graded buffer layers. This is commonly overcome by performing a chemical-mechanical polish (CMP) before growth of the desired epitaxial device structures. Such CMP processes further add to the cost and also expose the surface to contamination and further difficulties and limitations from regrowth on this once exposed interface. A further disadvantage of this thick graded buffer layer approach arises from the coefficient of thermal expansion (CTE) mismatch between Ge ($5.90 \times 10^{-6}$ K$^{-1}$) and Si ($2.57 \times 10^{-6}$ K$^{-1}$). This CTE mismatch can lead to defect formation and/or to breaking or cracking of a wafer including a thick buffer layer as temperature is varied during post-growth processing.

Management of lattice mismatch strain is particularly relevant for fabrication of quantum wells, which are often used in various optoelectronic devices. A quantum well includes a thin semiconductor well layer sandwiched between two semiconductor barrier layers. The well layer thickness is typically less than about 10 nm, and the energy bandgap of the well layer is less than the energy bandgap of the barrier layers. Further, the effective bandgap and optical properties of this well layer are dependent upon the layer thickness, hence, uniformity on a scale around 1 nm or better is extremely critical. Quantum wells in the SiGe material system are considered in U.S. Pat. No. 6,784,466 (referenced above), U.S. Pat. No. 5,886,361 and in US 2005/0141801. However, as indicated in U.S. Pat. No. 5,886,361 and US 2005/0141801, SiGe quantum wells tend to have poor electron confinement, since most of the quantum well bandgap discontinuity is in the valence band. The device of U.S. Pat. No. 5,886,361 does not require electron confinement in the quantum wells, and doping with electron donors is considered in US 2005/0141801 to improve electron confinement.

Accordingly, it would be an advance in the art to provide SiGe quantum wells having improved optical properties, especially when undoped. It would be a further advance in the art to provide such quantum wells on a Si substrate without the use of a graded buffer layer for lattice mismatch.

SUMMARY

The present invention provides SiGe quantum wells where the well material has a conduction band energy local minimum at k=0 (the Γ point of the first Brillouin zone). Quantum well structures that satisfy this condition have "Kane-like" bands at and near k=0 which can provide physical effects useful for various device applications, especially optical modulators. In the $Si_{1-x}Ge_x$ material system, this condition on the band structure is satisfied for x greater than about 0.7. The quantum well barrier composition may or may not have Kane-like bands. A preferred method of providing such quantum well structures on a substrate (e.g., a silicon substrate) is to grow a first Ge-rich SiGe buffer layer on the substrate, and then anneal the resulting layered structure. In many cases it is further preferred to grow a second Ge-rich SiGe buffer layer on top of the first buffer layer and anneal the resulting layered structure.

Quantum well structures of the invention are broadly applicable to electronic, optoelectronic and spintronic devices. Application of the invention to optical modulators is especially promising.

In some embodiments of the invention, an operating temperature of an optical modulator is altered away from room temperature to provide operation in a specific wavelength range. For example, optical communication bands such as the C band from 1530 nm to 1565 nm can be covered in this manner.

BRIEF DESCRIPTION OF THE DRAWINGS

FIGS. 1a-c show schematic E-k band diagrams for several kinds of semiconductor materials.

DETAILED DESCRIPTION

Figure 2:
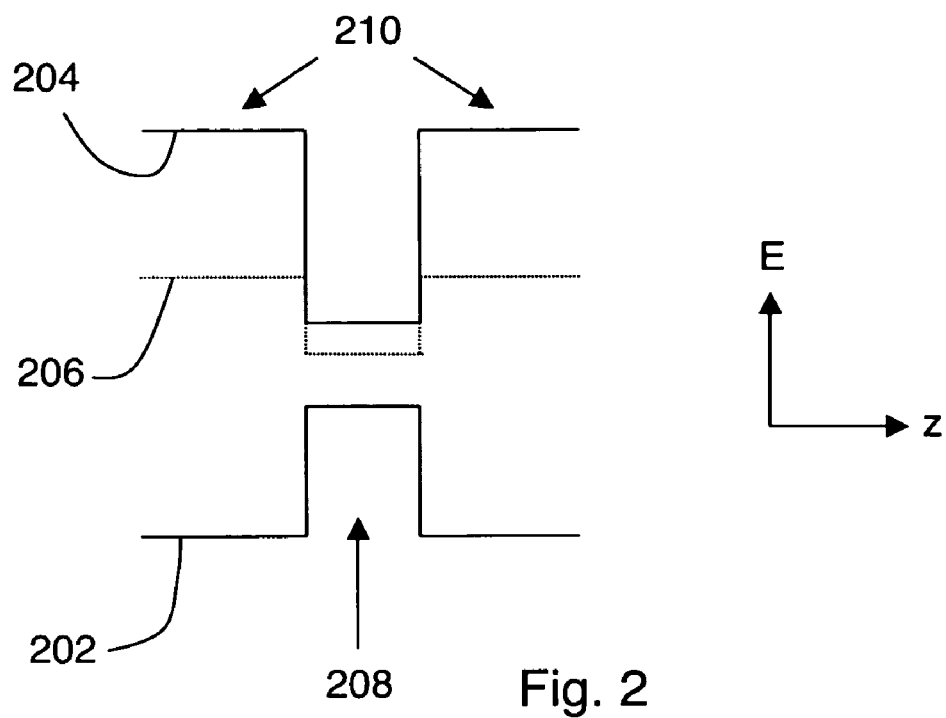
FIG. 2 shows an energy-position band diagram of a quantum well structure according to an embodiment of the invention.

In order to appreciate the invention, it is best to consider several typical semiconductor E-k (energy-momentum) band diagrams. FIG. 1a shows the band structure of a typical direct-gap semiconductor (e.g., GaAs). Heavy hole band 102 and light hole band 104 both have maxima at k=0. The lowest energy conduction band 120 has a local minimum 106 at k=0 and a local minimum 108 at nonzero k. Since local minimum 106 is at a lower energy than local minimum 108, the bandgap is direct.

FIG. 1b shows the band structure of certain indirect-gap semiconductors (e.g., Ge). Heavy hole band 102 and light hole band 104 both have maxima at k=0. The lowest energy conduction band 120 has a local minimum 106 at k=0 and a local minimum 108 at nonzero k. Since local minimum 108 is at a lower energy than local minimum 106, the bandgap is indirect.

FIG. 1c shows the band structure of certain other indirect-gap semiconductors (e.g., Si). Heavy hole band 102 and light hole band 104 both have maxima at k=0. The lowest energy conduction band 120 has a local minimum 108 at nonzero k, but does not have a local minimum at k=0. Instead, there is a local maximum 110 at k=0. Since local minimum 108 is the lowest energy point in conduction band 120, the bandgap is also indirect. FIGS. 1a-c are schematic, and irrelevant band structure features (e.g. other energy bands) are omitted for clarity. Similarly, details of the locations of indirect conduction band minima in k-space are irrelevant.

A key discovery of the present invention is that indirect bandgap materials of the kind shown in FIG. 1b can have favorable optical properties compared to indirect bandgap materials of the kind shown in FIG. 1c. From this point of view, it is inaccurate to attribute the poor optoelectronic properties of silicon to its indirect bandgap. Instead, it is more accurate to attribute the poor properties of silicon to its band structure (FIG. 1c). Semiconductors having a conduction band minimum at k=0 and valence band maxima at k=0 are regarded as having Kane-like bands. Using this terminology, FIGS. 1a-b have Kane-like bands, while FIG. 1c does not have Kane-like bands. Thus, a key aspect of the invention is the use of indirect bandgap materials having Kane-like bands for optoelectronic devices, especially quantum wells.

The reason the shape of the conduction band at k=0 is critical is that optical transitions on an E-k band diagram are vertical (to a good approximation). Since the highest energy occupied state in the valence band is nearly always at or near k=0, inter-band optical absorption is strongly affected by the band structure at and near k=0. However, it is still possible for the presence of lower energy conduction band minima at non-zero k to spoil the optical performance of a material having Kane-like bands. For example, an optical modulator that is based on free carrier-absorption by electrons in a quantum well will require good confinement of electrons to the quantum well. As indicated above, electron confinement in SiGe quantum wells (which is determined by the indirect bandgap) tends to be poor. Another possible mechanism for degraded optical performance in indirect Kane-like materials is electron scattering from the k=0 conduction band minimum to lower energy conduction band minima having non-zero k. Depending on the scattering rate, this effect can degrade or even eliminate physical effects associated with the k=0 band structure.

A second key discovery of the present invention is that the SiGe/Ge material system is a suitable material system for practicing the invention. More specifically, as discussed later, experimental evidence has been obtained showing clear evidence of physical effects from the k=0 band structure of Ge quantum wells that can be exploited for device applications. As indicated above, Ge is Kane-like, Si is not Kane-like, and we have found that $Si_{1-x}Ge_x$ is Kane-like for x greater than about 0.7. Thus the invention relates to Ge quantum wells and to $Si_{1-x}Ge_x$ quantum wells having x greater than about 0.7.

FIG. 2 shows an energy-position band diagram for a quantum well structure according to an embodiment of the invention. A well layer 208 is sandwiched between two barrier layers 210. Well layer 208 is a $Si_{1-x}Ge_x$ layer having x greater than about 0.7, so that it has Kane-like bands. Barrier layers 210 are preferably $Si_{1-x}Ge_x$ layers having x between about 0.4 and 0.95. Barrier layers 210 can have either the same composition or different compositions. Barrier layers 210 can have Kane-like bands, although this is not necessary. In some cases it is preferred for the barriers to not have Kane-like bands, since device saturation by electrons accumulating in the barriers may thereby be reduced.

Valence band 202 shows that the quantum well acts to confine holes. Indirect conduction band 206 shows that the quantum well acts to confine electrons, although this confinement is relatively weak. Direct conduction band 204 shows a much more pronounced conduction band discontinuity than the indirect conduction band 206. More precisely, the quantum well energy is the difference in direct bandgap (i.e., k=0 energy gap) between the barrier layers and the well layer. The direct conduction band discontinuity of the structure is about 30% to about 80% of the quantum well energy.

FIG. 2 shows what is known as Type-I band line up, where the valence band maximum and the direct conduction band minimum of the quantum well structure as a function of position are both located in the quantum well layer. Type-I band line up is the most favorable kind of quantum well band line-up for optoelectronic device applications. The presence of Type-I band line-up in the SiGe/Ge material system is a further reason to expect favorable optoelectronic device results in the SiGe/Ge material system. Type I band line up can be inferred in the SiGe/Ge material system by noting that substantial evidence shows that Ge quantum wells do confine holes (i.e., the valence band is type I), and noting that the direct energy gap is a rapidly increasing function of Si concentration in the SiGe system. Thus the expected band structure is as shown on FIG. 2 (i.e., Type I).

Various physical effects can be exploited to provide optoelectronic devices. In the present invention, preferred physical mechanisms do not rely on electron confinement in the quantum well, since such confinement is weak in the SiGe material system. Instead, preferred physical effects relate to electric field induced shifts in the direct absorption edge of the quantum well structure such as the Quantum Confined Stark Effect (QCSE), the Wannier-Stark effect, and the Franz-Keldysh effect. These effects can provide both electro-absorption (i.e., a field-dependent absorption) and electro-refraction (i.e., a field-dependent refractive index). Devices can be based on one or several of these effects. Typically, devices based on such effects are fabricated as P-I-N diodes with the quantum wells in the I region (i.e., the quantum wells are not intentionally doped).

Figure 3:
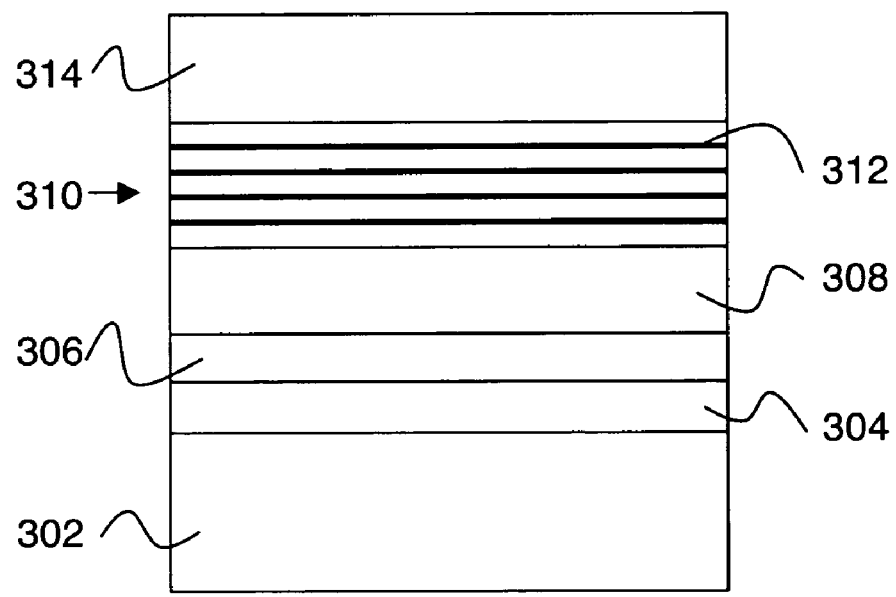
FIG. 3 shows a multiple quantum well structure according to an embodiment of the invention.

FIG. 3 shows an exemplary optoelectronic device structure according to an embodiment of the invention. A substrate 302 has first and second SiGe buffer layers 304 and 306 grown on it respectively. Substrate 302 is preferably a silicon substrate, although it can also be a substrate suitable for silicon on insulator (SOI) or SiGe on insulator (SGOI) growth. On top of buffer layer 306 an active region including an undoped SiGe region 310, a SiGe first contact layer 308 and a SiGe second contact layer 314 is grown. First and second contact layers 308 and 314 have opposite doping such that one of the two layers is P-type and the other is N-type. Undoped region 310 includes one or more quantum wells 312, where each of quantum wells 312 is as described in connection with FIG. 2. The resulting device structure is a SiGe P-I-N diode having SiGe quantum wells in the I region. This is a preferred device geometry for applying a variable electric field to the quantum wells, since varying a reverse bias on the diode changes the electric field at the quantum wells.

Buffer layers 304 and 306 provide a preferred approach for dealing with the lattice mismatch between Si and SiGe (or Ge) and with surface roughness of the buffer layer. Buffer layer 304 is preferably a Ge-rich SiGe buffer layer having a thickness of about 250-500 nm and a surface roughness of about 1 nm or better deposited on substrate 302 by chemical vapor deposition at a growth temperature of about 300° C. to about 700° C. After the growth of buffer layer 304, the layered structure including substrate 302 and layer 304 is annealed at a temperature of about 550° C. to about 930° C., preferably for about 30-60 minutes.

After this annealing, it is preferred, although not required, to deposit a second Ge-rich SiGe buffer layer 306 also having a thickness of about 250-500 nm on layer 304 by chemical vapor deposition at a growth temperature of about 300° C. to about 700° C. After the growth of buffer layer 306, the layered structure including substrate 302 and layers 304 and 306 is preferably annealed at a temperature of about 550° C. to about 930° C., preferably for about 10-30 minutes.

The compositions of buffer layers 304 and 306 are preferably selected such that device layers 308, 310, 312 and 314 as a whole are lattice matched to the device substrate provided by substrate 302 and buffer layers 304 and 306. Techniques for such strain compensation (or strain balancing) are known in the art. For example, if the device layers include Ge quantum wells and $Si_{0.2}Ge_{0.8}$ barriers having equal total well and barrier thickness, then the buffer layer composition should be $Si_{0.1}Ge_{0.9}$ to compensate the strain.

We have found that this growth method provides a device substrate including substrate 302 and layers 304 and 306 that is suitable for the further growth of device-quality SiGe material. In particular, the lattice constant at the top of layer 306 is close to that of the following SiGe device layers, and layer 306 is relaxed and has low defect density. Since buffer layers 304 and 306 are relatively thin compared to conventional graded composition buffer layers, the effect of CTE mismatch is advantageously reduced. The invention can also be practiced by growing a thick buffer layer having a graded SiGe composition in order to accommodate the lattice mismatch, but this approach is not preferred.

Figure 4:
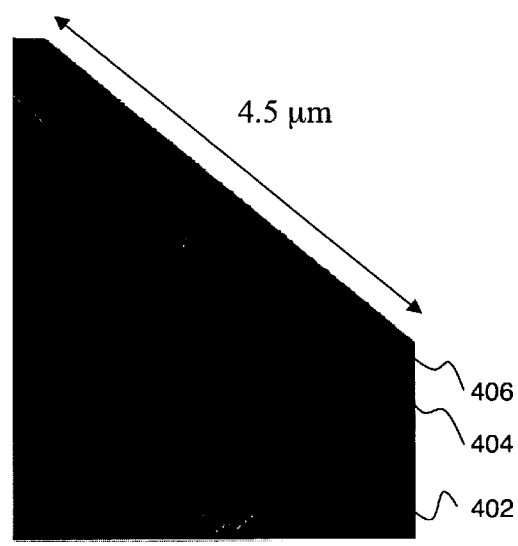
FIG. 4 is a transmission electron microscope (TEM) photograph of annealed SiGe buffer layers according to an embodiment of the invention.

FIG. 4 is a transmission electron microscope (TEM) photograph of annealed SiGe buffer layers grown on silicon according to an embodiment of the invention. Substrate 402 and buffer layers 404 and 406 on FIG. 4 correspond to substrate 302 and buffer layers 304 and 306 on FIG. 3. Buffer layers 404 and 406 are 300 nm thick layers of $Si_{0.05}Ge_{0.95}$. No threading dislocations are seen in the top buffer layer 406 in this TEM image.

Figure 5:
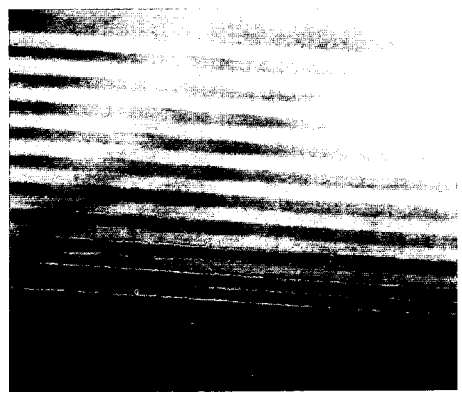
FIG. 5 is a TEM photograph of SiGe quantum wells according to an embodiment of the invention.

FIG. 5 is a TEM photograph of SiGe quantum wells grown on a device substrate similar to that of FIG. 4, except that the buffer Ge concentration here is 90%, according to an embodiment of the invention. In the example of FIG. 5, the quantum well composition is pure Ge, and the barrier composition is $Si_{0.15}$—$Ge_{0.85}$. The well and barrier thicknesses are 10 nm and 16 nm respectively. The result of FIG. 5 demonstrates growth of a high-quality SiGe heterostructure on a silicon substrate.

Figure 6:
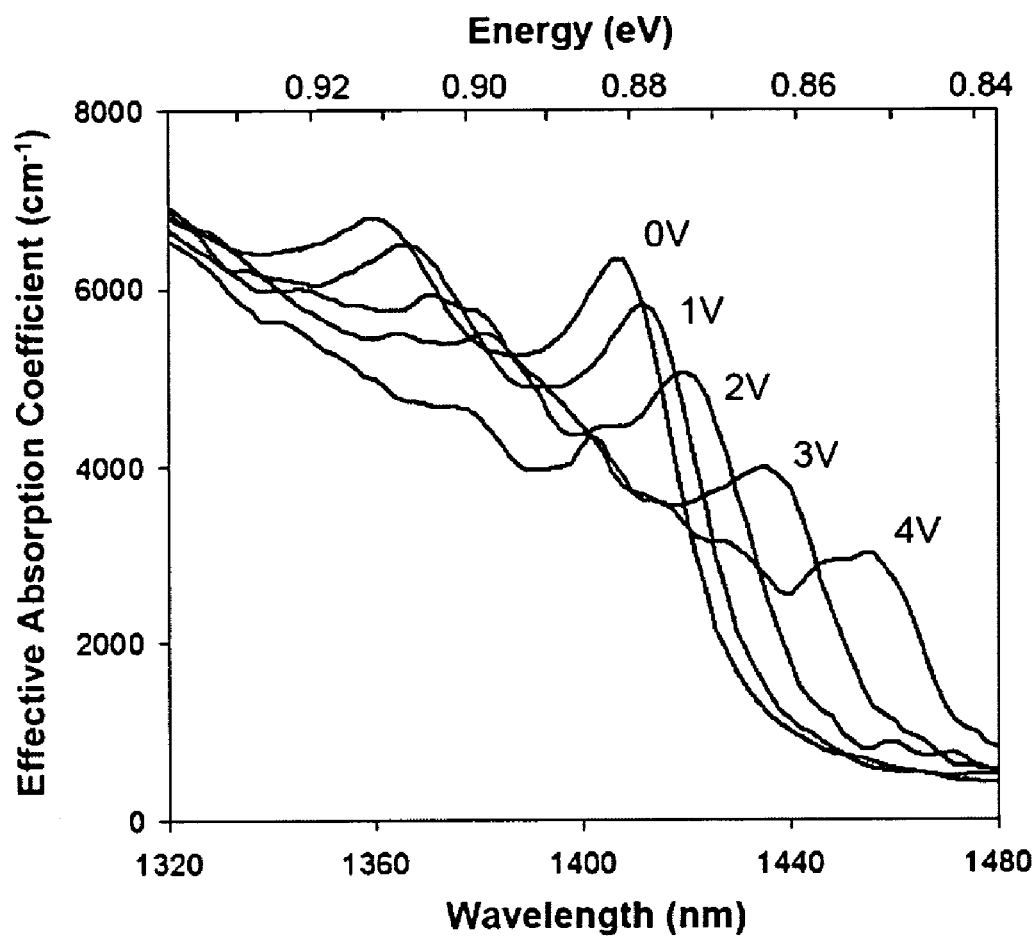
FIG. 6 shows experimental results from a quantum well sample according to an embodiment of the invention.

FIG. 6 shows experimental results from a quantum well sample according to an embodiment of the invention. The results of FIG. 6 are obtained from a SiGe P-I-N diode grown on a Si substrate having 10 Ge quantum wells in the I region. The quantum wells have a thickness of 10 nm. The barriers are 16 nm layers of $Si_{0.15}$—$Ge_{0.85}$. This sample was grown on a device substrate having two 250 nm $Si_{0.1}$—$Ge_{0.9}$ buffer layers. As the reverse bias applied to the diode increases from 0 V to 4 V, a strong shift of the optical absorption edge toward longer wavelengths is observed, consistent with the Quantum Confined Stark Effect (QCSE). The results of FIG. 6 clearly demonstrate that even though Ge is an indirect bandgap material, it can exhibit physical effects (e.g. the QCSE) which are useful for optoelectronic devices and which are commonly thought to require direct gap materials. As indicated above, this behavior is attributed to the Kane-like bands of Ge.

The QCSE observed on FIG. 6 can readily be exploited for device applications. For example, consider an optical modulator operating at 1440 nm and including the quantum wells of FIG. 6 in its active region. The optical absorption provided by such a device will have a strong dependence on the applied bias voltage.

Quantum wells according to the invention can be used in electronic, optoelectronic, optical or spintronic devices. The invention is especially applicable to optical modulators, since optical modulators often require sophisticated device structures such as quantum wells, but typically do not require extremely low defect density. Optical modulators tend to be more tolerant of material defects than optical sources (e.g., lasers) because optical modulators are typically not high-current devices.

Various geometrical configurations for optical modulators are known, having different optical coupling geometries and/or different electric field biasing geometries. The invention is applicable to any optical modulator geometrical configuration, since the active region of any such modulator can include Ge or SiGe quantum wells as described above. FIGS. 7-11 show some exemplary optical modulator configurations.

In each case, the quantum wells are present in the I region of a P-I-N diode, and the examples differ in geometric detail.

Figure 7:
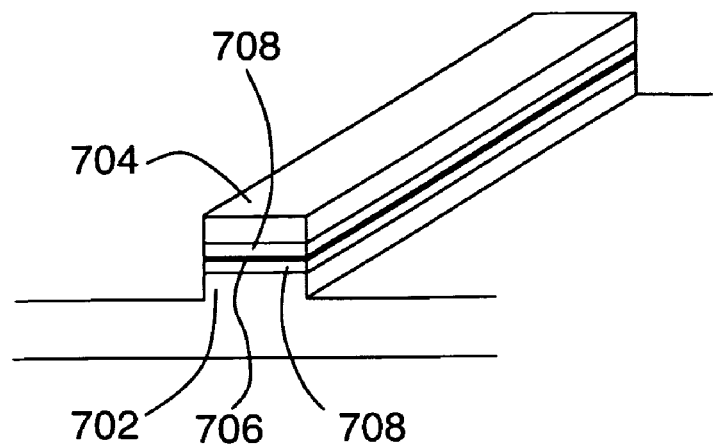
FIG. 7 shows a waveguide optical modulator according to an embodiment of the invention.

FIG. 7 shows a waveguide optical modulator according to an embodiment of the invention. In this example, an intrinsic region 708 includes one or more Ge or SiGe quantum wells 706 as described above. Intrinsic region 708 is sandwiched between P-region 704 and N-region 702 to form a P-I-N diode. Alternatively, region 704 can be N-type and region 702 can be P-type. The P-I-N diode in this example is configured as an optical waveguide (e.g., region 708 has a higher refractive index than the surrounding material), such that light propagates along the axis of the waveguide and in the plane of quantum well (or wells) 706. Light can be coupled to and from the optical waveguide by various known methods (e.g., lensed fiber coupling, lens coupling, etc.). The waveguide approach provides a long interaction length and efficient overlap between the quantum wells and waveguide mode. However, coupling light to a waveguide can present practical difficulties. The example of FIG. 7 shows a vertical P-I-N diode. A lateral P-I-N diode can also be used in a waveguide configuration, although it is not preferred.

Figure 8:
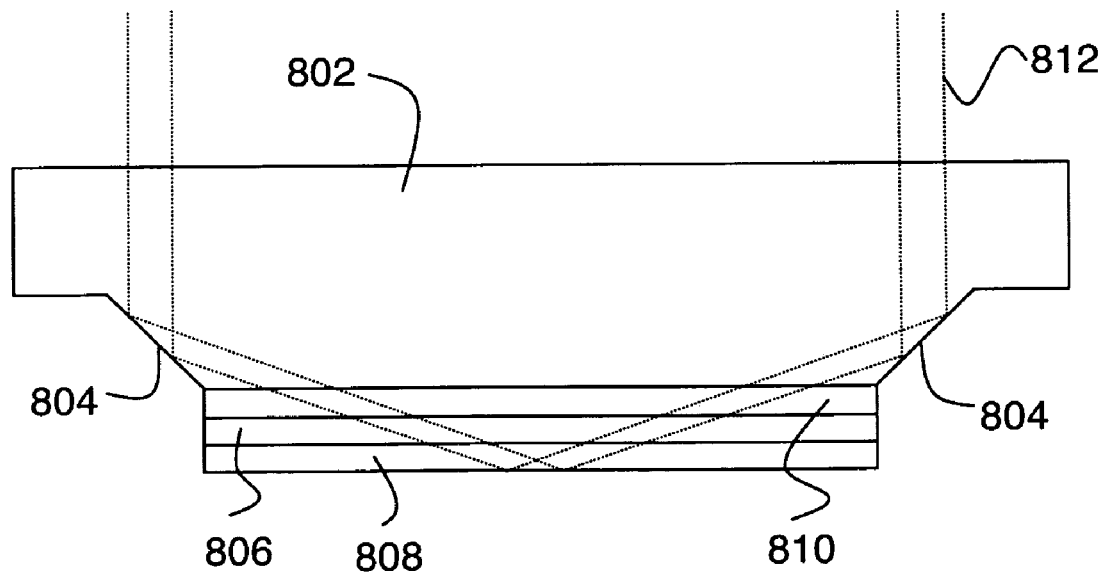
FIG. 8 shows an angled-facet optical modulator according to an embodiment of the invention.

FIG. 8 shows an angled-facet optical modulator according to an embodiment of the invention. In this approach, region 806 is an I region including Ge or SiGe quantum wells (not shown) as described above. Regions 808 and 810 are P-type and N-type (or N-type and P-type) regions respectively of a P-I-N diode. A coupling structure, preferably made of silicon which is transparent at the operating wavelengths of SiGe or Ge quantum wells, is positioned adjacent to the P-I-N diode such that a light path 812 is provided through the P-I-N diode by reflection from angled faces 804. Angled faces 804 are preferably formed by V-groove etching, which can be performed with high precision in silicon. In this case, the light propagates at an angle with respect to the quantum well plane that is other than 0 or 90 degrees. This approach provides easier input and output coupling than a waveguide modulator, but the overlap between the light beam and the quantum wells is typically not as high as in the waveguide configuration.

Figure 9:
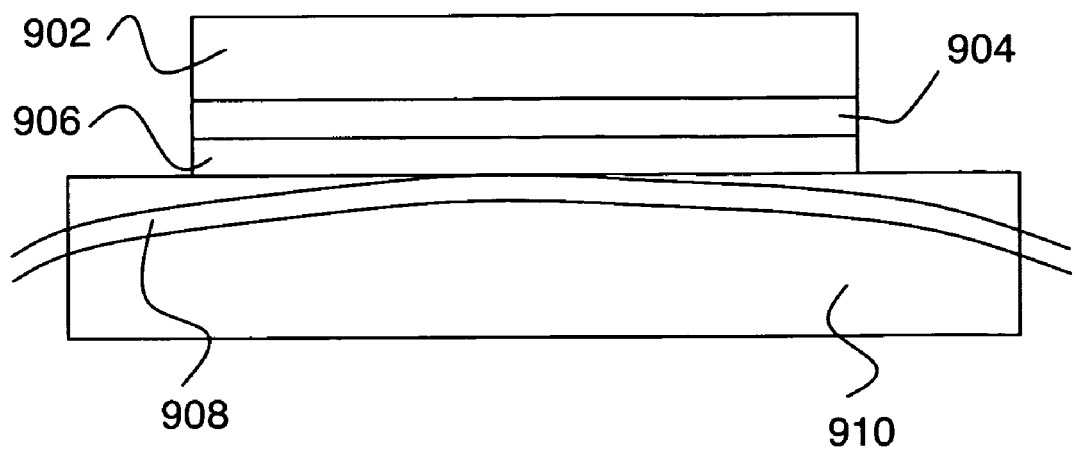
FIG. 9 shows an evanescent-wave coupled optical modulator according to an embodiment of the invention.

FIG. 9 shows an evanescent-wave coupled optical modulator according to an embodiment of the invention. In this example, a P-I-N active region 906 including Ge or SiGe quantum wells (not shown) as described above is disposed next to a mirror region 904 which is on a substrate 902. Mirror region 904 can be a metallic reflective layer, but is preferably a multi-layer distributed Bragg reflector (DBR). Optical coupling to active region 906 is evanescent coupling from a side polished fiber 908 embedded in a fiber block 910. In this configuration, active region 906 and mirror region 904 preferably act as an anti-resonant optical waveguide (ARROW waveguide) having active region 906 in its core, such that a leaky mode of the ARROW waveguide resonantly couples to the evanescent fiber mode to improve coupling efficiency. This approach also provides easier input and output coupling than a waveguide modulator, but the overlap between the light beam and the quantum wells is typically not as high as in the waveguide configuration.

Figure 10:
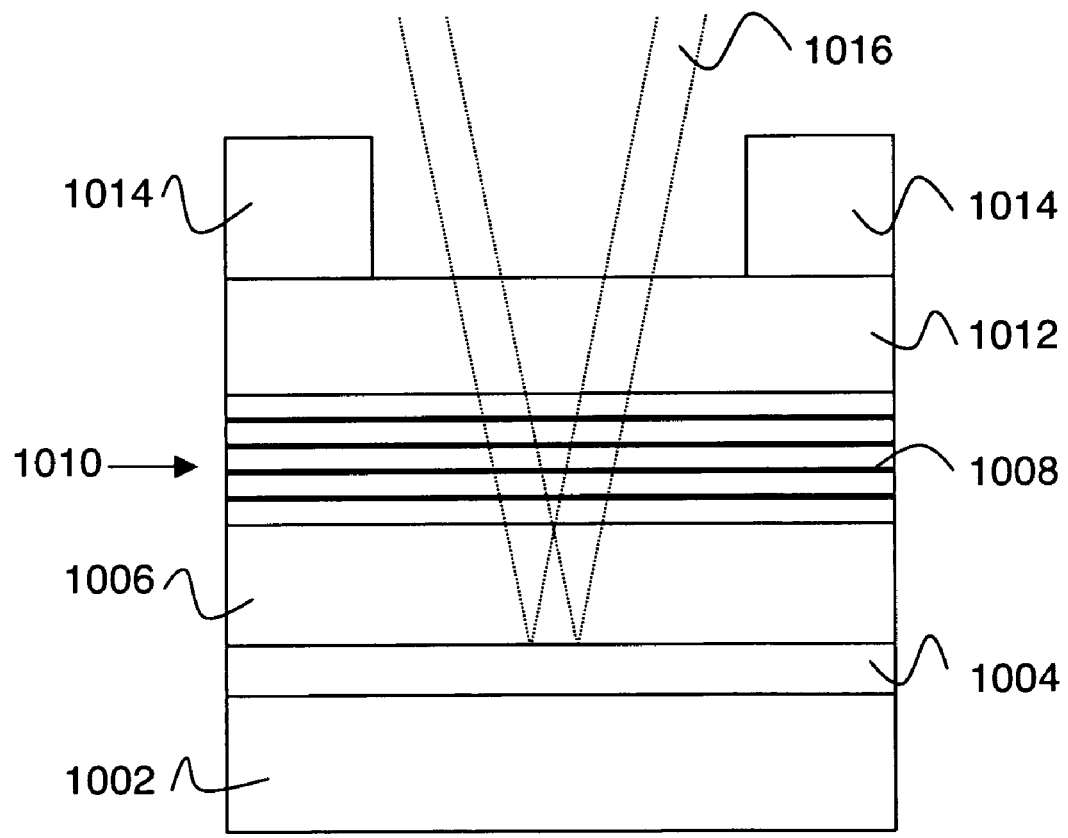
FIG. 10 shows a top-illuminated reflection optical modulator according to an embodiment of the invention.

FIG. 10 shows a top-illuminated reflection optical modulator according to an embodiment of the invention. In this example, a reflective region 1004 is disposed on top of a substrate 1002. Reflective region 1004 can be a metallic reflective layer or it can be a multi-layer DBR. A bottom electrode layer 1006 and a top electrode layer 1012 are N-type and P-type (or P-type and N-type) SiGe layers respectively. Intrinsic region 1010 is a SiGe region including one or more Ge or SiGe quantum wells as described above. A top electrode 1014 makes electrical contact to top electrode layer 1012, and a bottom electrode (not shown) makes electrical contact to bottom electrode layer 1006. Light modulated by this device follows beam path 1016. The angle between input and output optical beam paths on FIG. 10 is exaggerated for clarity. In fact, this angle is often zero, and in such cases input and output light can be separated by an optical beamsplitter. Thus light propagates perpendicular to the plane of the quantum well in this kind of modulator.

Transmissive devices similar to the device of FIG. 10, except that reflective region 1004 is omitted, can also be considered. Devices where the light propagates perpendicular to the plane of the quantum wells are referred to as "surface-normal" devices, which include both reflective and transmissive devices as described above. Input and output coupling tends to be relatively simple for surface-normal modulators, but the interaction length tends to be significantly lower for surface-normal modulators than in the waveguide approach of FIG. 7 or in the "side-coupling" approaches of FIGS. 8 and 9.

Because of this decreased interaction length, surface-normal modulators tend to require a significantly larger number of quantum wells in the active region in order to provide a desired level of modulation performance than waveguide or "side-coupled" modulators. Foe example, 20-70 quantum wells may be needed in a surface-normal modulator, while a waveguide modulator may need only 1-3 quantum wells. Having a large number of quantum wells in the active region can present two difficulties. The first difficulty is that the thicker a structure is, the more carefully strain due to lattice constant mismatch has to be considered. As indicated above, strain compensation techniques are known for addressing this issue. Also as indicated above, modulators tend to be relatively tolerant of material defects. For example, dislocations which would undesirably increase dark current in a detector would have comparatively little impact on a modulator, since dark current is not a critical modulator parameter.

The second difficulty is that having a thick I-region with many quantum wells in it increases the reverse voltage required to provide a given electric field to the quantum wells. QCSE modulators having a small number (e.g., 1-3) of quantum wells can have operating voltages that are consistent with CMOS operating voltages (e.g., ~1 V or less). However, QCSE modulators having a large number of quantum wells in series in an I region can have operating voltages significantly higher than readily available in CMOS circuitry.

Figure 11:
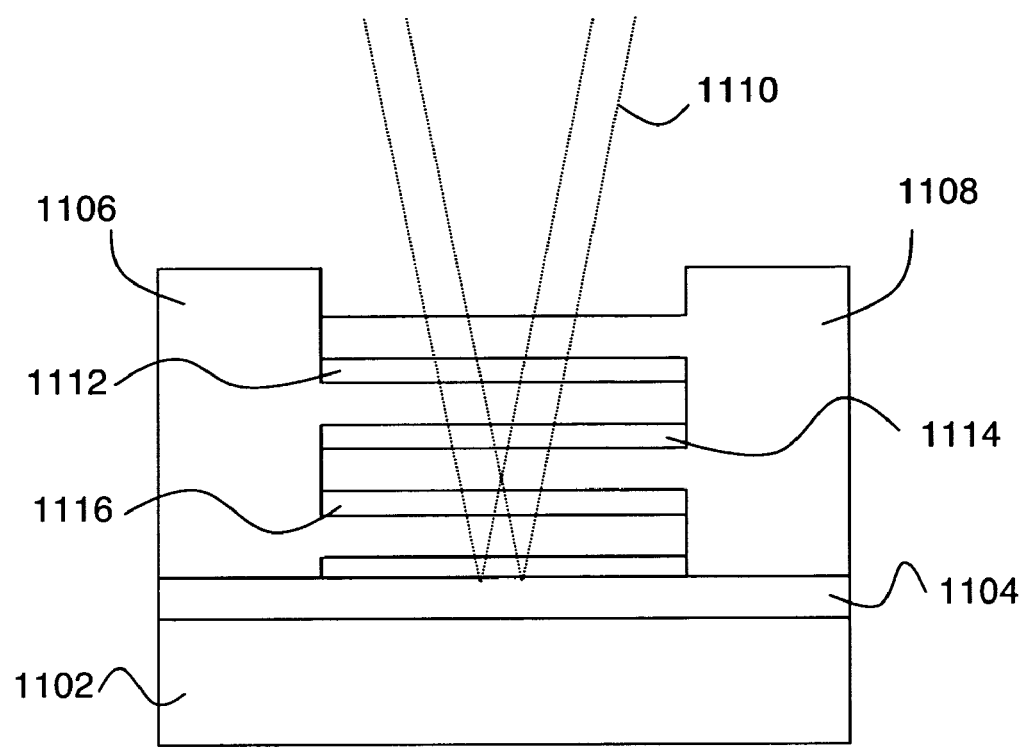
FIG. 11 shows a top-illuminated reflection optical modulator having vertically interdigitated electrodes according to an embodiment of the invention.

This problem of excessive operating voltage is addressed by the configuration of FIG. 11, which has vertically interdigitated electrodes. Here a reflective region 1104 is disposed on a substrate 1102. Reflective region 1104 can be a metallic reflective layer or it can be a multi-layer DBR. A first electrode 1106 and a second electrode 1108 are oppositely doped (i.e., 1106 is P-type and 1108 is N-type, or vice versa). Electrodes 1106 and 1108 are vertically interdigitated, as shown on FIG. 11, such that two or more undoped regions 1112, 1114, 1116 are between the "fingers" of electrodes 1106 and 1108. The example of FIG. 11 shows three such undoped regions, but the invention can be practiced with any number of electrode fingers and undoped regions. Each undoped region includes one or more (preferably about 1-3) SiGe or Ge quantum wells as described above. Light follows optical path 1110 on FIG. 11. The angle between input and output light paths of FIG. 11 is exaggerated for clarity in the same way as described in connection with FIG. 10.

The arrangement of FIG. 11 provides electrical bias to the several undoped regions in parallel, thereby reducing the applied voltage required to provide a given electric field to the quantum wells. This arrangement can provide a reflective modulator having CMOS-compatible operating voltages.

The preceding examples are representative, and are not an exhaustive description of modulator configurations. The invention is also applicable to many other modulator configurations, such as amplitude and/or phase modulators, reflective and/or transmissive modulators, and modulators with and without a resonant cavity. This invention is also applicable to optoelectronic devices other than modulators (e.g., sources and detectors), and to electronic and spintronic devices.

Telecommunications is an important application for optoelectronic devices. Therefore, it is useful to provide optoelectronic devices suitable for use in optical communication wavelength bands (e.g., the C band from ~1530 nm to ~1565 nm). SiGe quantum well devices according to the above described embodiments of the invention tend to operate at wavelengths somewhat shorter than the C band. For example, the results shown on FIG. 6 show modulation from about 1440 nm to about 1470 nm.

Figure 12:
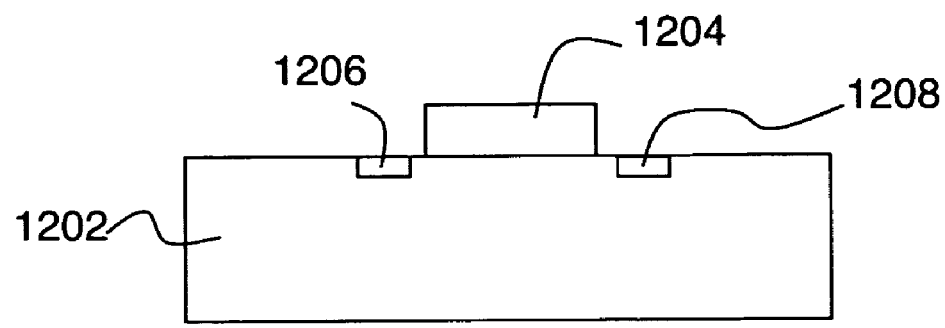
FIG. 12 shows a temperature controlled optical modulator according to an embodiment of the invention.

Increasing the quantum well width and decreasing the quantum well strain can both be employed to increase the operating wavelength of SiGe quantum well devices. However, to reach the C band, it is preferred and may be required to also operate the modulator at an elevated temperature. FIG. 12 shows an example of such a configuration. A substrate 1202 (e.g., a silicon chip) includes a SiGe modulator 1204, a temperature sensor 1206 and a temperature control element 1208. SiGe modulator 1204 includes SiGe quantum wells as described above, and can have any geometrical configuration for optical input and output, including those considered above. The temperature dependence of modulator operation does not depend critically on details of the modulator geometry or configuration.

The absorption edge wavelength increases with increasing temperature at a rate of about 0.83 nm/° C. (0.47 meV/° C.) in this material system. For typical quantum well strains and widths, operation at elevated temperatures, preferably between about 35° C. and about 120° C., and more preferably between about 80° C. and about 100° C., will provide C-band operation. The reliability and performance of optical modulators is not degraded by operation at such elevated temperatures, unlike some other devices (such as semiconductor lasers), so operation at elevated temperatures does not raise significant practical issues.

Heating (or cooling) the modulator, as well as providing temperature control such that the operating temperature of the modulator is a predetermined operating temperature other than room temperature, can be accomplished with standard temperature control techniques. For example, temperature control element 1208 can be a resistor, a diode, a dissipative electrical circuit, a thermoelectric heater, a thermoelectric cooler, or any other structure capable of heating or cooling modulator 1204. Any kind of temperature sensor can be employed in practicing the invention, including but not limited to diodes, thermistors and thermocouples. Temperature sensor 1206 can provide an actual temperature of the active region of modulator 1204 to a temperature controller (not shown). The temperature controller can drive the temperature control element 1208 such that the actual temperature is maintained at or near the predetermined operating temperature. Such control can be provided with any control method (e.g., negative feedback). Temperature can also be controlled by varying thermal resistance from modulator 1204 to a heat sink.

Figure 13:
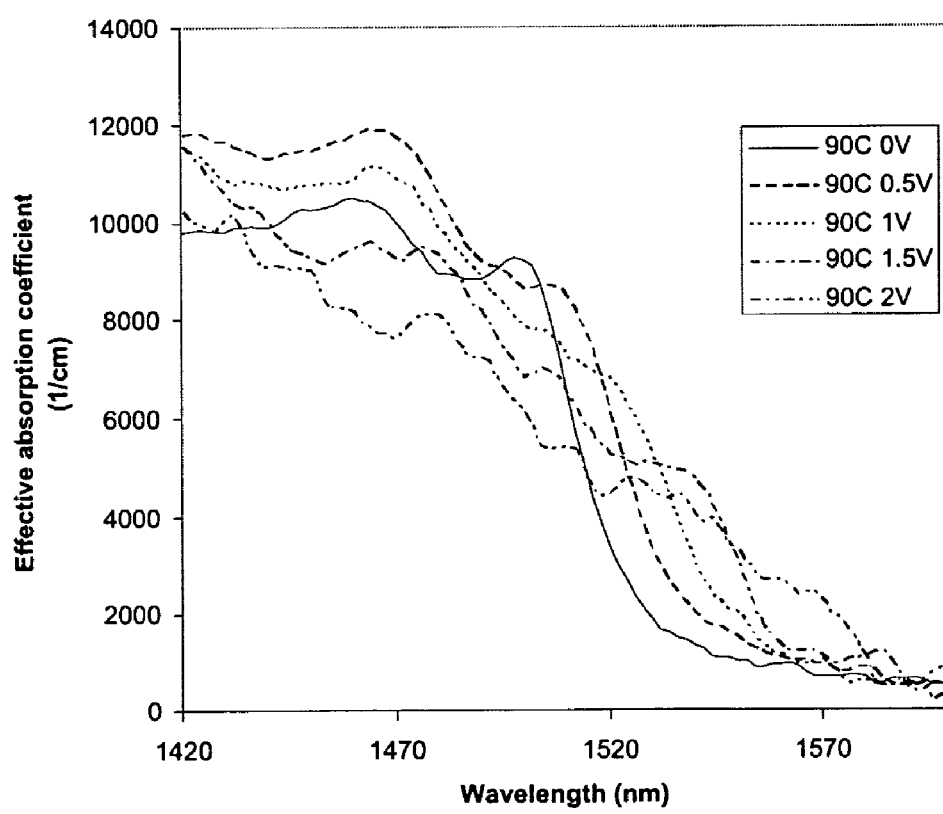
FIG. 13 shows a C-band optical modulator according to an embodiment of the invention operating at a temperature of 90° C.

FIG. 13 shows results from an embodiment of the invention operating at 90° C. In this example, a PIN diode similar to the structure of FIG. 3 includes an MQW active region. The MQW active region includes 10 Ge quantum wells with 12.5 nm well thickness separated by 5 nm thick $Si_{0.175}Ge_{0.825}$ barriers and is sandwiched between 50 nm thick undoped spacer layers of $Si_{0.05}Ge_{0.95}$. The undoped spacer layers reduce diffusion of dopants into the MQW active region. This structure was grown on top of a relaxed $Si_{0.05}Ge_{0.95}$ buffer layer on a Si substrate. The effective absorption coefficient of the exciton peak at zero bias is 9240 $cm^{-1}$. As the reverse bias is changed from 0 V to 2 V, the absorption edge shifts from 1500 nm to 1560 nm due to the QCSE. The effective absorption coefficient has a maximum change of 2703 $cm^{-1}$ at 1538 nm, as reverse bias is altered from 0 V to 1.5 V. The peak contrast ratio of effective absorption coefficients between 0 V and 2 V reverse bias is 3.6 at 1564 nm, and this ratio is greater than 3 for a 20 nm optical bandwidth. Although the relatively large quantum well thickness in this example has reduced confinement and weakened the exciton binding, the magnitude and shift of the QCSE are comparable to those of III-V material at similar wavelengths. Accordingly, this example demonstrates useful C-band modulation performance despite operation at elevated temperature and the use of thick quantum wells.

In this example, heating a modulator to provide C-band operation is considered. It is also possible to heat (or cool) a modulator to any predetermined temperature (other than room temperature). Such temperature control can provide modulator operation in any other wavelength band or region of interest according to principles of the invention.

The invention claimed is:

1. An optical modulator comprising:
   an active region including one or more semiconductor quantum well structures, each comprising:
   a well layer having a composition $Si_{1-x}Ge_x$, wherein x is greater than about 0.7 and is selected such that an energy-momentum relation $E_w(k)$ of the lowest energy conduction band of the well layer at k=0 has a local minimum at k=0;
   a first barrier layer having a composition $Si_{1-y}Ge_y$ and disposed on a first side of the well layer, wherein y<x; and
   a second barrier layer having a composition $Si_{1-z}Ge_z$ and disposed on a second side of the well layer opposite the first side, wherein z<x;
   a temperature control element disposed in proximity to the active region, capable of maintaining the active region at a predetermined operating temperature other than room temperature;
   wherein an electric field responsive to an electrical input to the device is present in the active region;
   whereby an optical response of the quantum well structure is altered by the electrical input;
   wherein a wavelength dependence of the optical response depends on the predetermined operating temperature.

2. The optical modulator of claim 1, wherein said predetermined operating temperature is selected such that said optical modulator provides optical modulation in an optical communication wavelength band.

3. The optical modulator of claim 2, wherein said wavelength band is from about 1530 nm to about 1565 nm.

4. The optical modulator of claim 1, further comprising a temperature sensor for sensing an actual temperature of said active region.

5. The optical modulator of claim 1, wherein said temperature sensor comprises a device selected from the group consisting of diodes, thermistors and thermocouples.

6. The optical modulator of claim 4, further comprising a temperature controller for maintaining said actual temperature at or near said predetermined operating temperature.

7. The optical modulator of claim 1, wherein said temperature control element comprises a device selected from the group consisting of: resistors, diodes, dissipative electrical circuits, thermoelectric heaters and thermoelectric coolers.

8. The optical modulator of claim 1, wherein x is about 1.0 and wherein said predetermined operating temperature is from about 35° C. to about 150° C., whereby said optical modulator can provide electro-absorption modulation in a wavelength band from about 1530 nm to about 1565 nm.

9. The optical modulator of claim 1, wherein y and z are each between about 0.4 and about 0.95.

10. The optical modulator of claim 1, wherein said one or more quantum well structures are not intentionally doped.

11. The optical modulator of claim 1, wherein a physical mechanism relating the optical response to the electric field is selected from the group consisting of: quantum confined Stark effect, Wannier-Stark effect, Franz-Keldysh effect, electro-absorption, electro-refraction, and combinations thereof.

12. The optical modulator of claim 1, wherein the active region has an average strain selected to provide an exact or approximate lattice match to an adjacent device substrate.

13. The optical modulator of claim 12, wherein the device substrate includes at least one annealed Ge-rich SiGe buffer layer deposited on a substrate.

14. The optical modulator of claim 1, wherein the optical response is an optical response of light propagating perpendicular to the quantum well layer.

15. The optical modulator of claim 1, wherein the optical response is an optical response of light propagating in the plane of the quantum well layer.

16. The optical modulator of claim 15, wherein the active region includes an optical waveguide within which the light propagates.

17. The optical modulator of claim 1, wherein the optical response is an optical response of light propagating at an angle other than 0 or 90 degrees with respect to the quantum well layer.

18. The optical modulator of claim 1, wherein the optical response is a reflectivity, transmissivity, or combination thereof.

19. The optical modulator of claim 1, wherein the optical response is an amplitude response, a phase response, or combination thereof.

20. The optical modulator of claim 1, wherein light is coupled into the device by a method selected from the group consisting of: waveguide coupling, free-space coupling, evanescent coupling, fiber coupling and coupling with integrated mirrors.

* * * * *